United States Patent [19]
Heikes et al.

[11] Patent Number: 5,343,096
[45] Date of Patent: Aug. 30, 1994

[54] SYSTEM AND METHOD FOR TOLERATING DYNAMIC CIRCUIT DECAY

[75] Inventors: Craig A. Heikes, Ft. Collins; Robert H. Miller, Jr., Loveland, both of Colo.

[73] Assignee: Hewlett-Packard Company, Palo Alto, Calif.

[21] Appl. No.: 885,584

[22] Filed: May 19, 1992

[51] Int. Cl.⁵ .......................................... H03K 19/003
[52] U.S. Cl. ............................ 307/480; 307/443; 307/268
[58] Field of Search ............... 307/268, 443, 480, 269, 307/272.1, 518, 453, 296.3, 260; 365/233, 265

[56] References Cited
U.S. PATENT DOCUMENTS

| | | | |
|---|---|---|---|
| 4,570,084 | 2/1986 | Griffin et al. | 307/452 |
| 4,614,973 | 9/1986 | Sorenson | 307/269 |
| 4,686,386 | 8/1987 | Tadao | 307/269 |
| 5,004,933 | 4/1991 | Widener | 307/269 |
| 5,086,236 | 2/1992 | Feemster | 307/269 |
| 5,087,835 | 2/1992 | Hattangadi | 307/269 |
| 5,155,393 | 10/1992 | Gongwen et al. | 307/480 |

Primary Examiner—Timothy P. Callahan
Assistant Examiner—My-Trang Nu Ton

[57] ABSTRACT

The present invention tolerates the decay of a dynamic logic circuit by preserving the logic state of the output before the decay. A slow clock detector is configured to detect a slow clock condition of the clock pertaining to the dynamic logic circuit. A tolerant storage device is configured to preserve the data output by command of the slow clock detector upon a detection of the slow clock condition.

18 Claims, 5 Drawing Sheets

1

SYSTEM AND METHOD FOR TOLERATING DYNAMIC CIRCUIT DECAY

BACKGROUND OF THE INVENTION

I. Field of the Invention

The present invention relates generally to dynamic logic in computers and, more particularly, to a system and method for tolerating decay of dynamic circuits operating at slow speeds.

II. Related Art

Dynamic logic gates are used in the conventional design of logic circuits which require high performance and modest size. Dynamic logic gates are much faster than static logic gates. Essentially, a dynamic logic gate is a circuit which requires a periodic electrical precharge, or refresh, such as with a dynamic random access memory (DRAM), in order to maintain and properly perform its intended logic function. Once the electrical precharge on the dynamic logic gate has been discharged, the dynamic logic gate can perform no other logic functions until subsequently precharged.

Although dynamic logic circuits can enhance the speed of logic evaluations, the use of dynamic logic circuits in combinational logic networks or pipelining is problematic. When combinational logic or pipelines comprise dynamic logic circuits, a minimum clock frequency must be maintained in order to insure proper functioning of the dynamic logic circuits. Proper operation of dynamic logic circuits requires that an electrical charge be deposited and maintained in the circuits. In reality, the charge deposited in the logic circuits eventually will decay to an unknown logic level and thereby corrupt the logic circuit output. The decay results from uncontrollable design and manufacture characteristics. In most practical situations, the preceding problem may be overcome via a periodic refresh cycle, similar to the refresh cycle in conventional dynamic random access memory (DRAM), invoked by the clock. Hence, a minimum clock rate, analogous to refresh cycles, must be maintained.

However, a minimum clock rate is oftentimes undesirable or impractical. The reason is that logic circuits are often required to intentionally operate slow, "at DC." For instance, logic circuits may be required to operate slow during integrated circuit (IC) testing. In the conventional art, dynamic logic circuits can be modified to exhibit slow operation by including "trickle charge" devices or "cross-coupled negative feedback" devices. However, these remedial devices consume valuable microchip area, decrease the speed of the dynamic logic circuits, and unnecessarily adds to the complexity of the circuits.

SUMMARY OF THE INVENTION

The present invention tolerates the decay of a dynamic logic circuit by preserving the logic state of the output before the decay. As a result, there is no need for a minimum clock rate, and the clock can be driven very slowly, or "at DC", for the purpose of, for example, IC testing or diagnostics.

Generally, the present invention comprises a slow clock detector and a tolerant storage device. The slow clock detector detects a slow clock condition of the clock pertaining to a dynamic logic circuit. The tolerant storage device is configured to preserve the data output from the dynamic-logic circuit by command of the slow clock detector upon a detection of the slow clock condition.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENT

Figure 1:
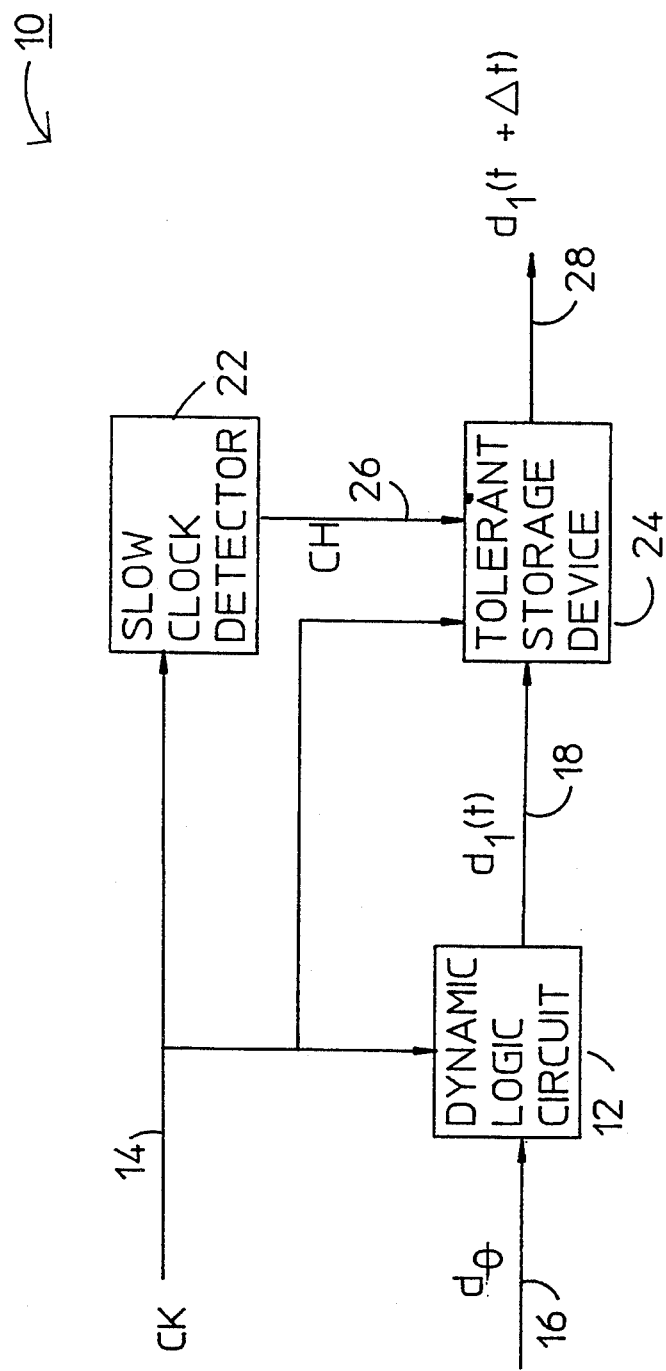
FIG. 1 shows a high level block diagram of the present invention.

In FIG. 1, a dynamic logic circuit 12 comprises any kind and configuration of dynamic logic gates, for example, domino logic gates as described in U.S. Pat. No. 5,208,490 issued on May 4, 1993 to J. Yetter, mousetrap logic gates, or gates from other dynamic logic families. The dynamic logic circuit 12 is precharged by a CK clock signal 14. Moreover, the dynamic logic circuit 12 operates upon input data $d_0$ so as to provide output data $d_1$, at reference numeral 18. In the conventional art, if the CK clock signal 14 is running slow so that input data $d_0$ is being processed at a low rate, or frequency, the dynamic gates (not shown) within the dynamic logic circuit 12 undesirably begin to lose their precharge. As a result, the output data $d_1$ will become tainted or unknown.

In accordance with the present invention, a slow clock detector 22 monitors the CK clock signal 14 and is configured to detect a slow clock condition. Furthermore, a tolerant storage device 24 is connected in series, or is cascaded, with the output data $d_1$, as shown, so as to preserve the binary logic value of the output data $d_1$ upon detection of a slow clock condition by the slow clock detector 22. Hence, the tolerant storage device 24 preserves the logic value of data $d_1$ for a time period equal to delta t corresponding to the time the CK clock signal 14 is halted, or in other words, $d_1(t) = d_1(t+\text{delta } t)$.

Figure 2:
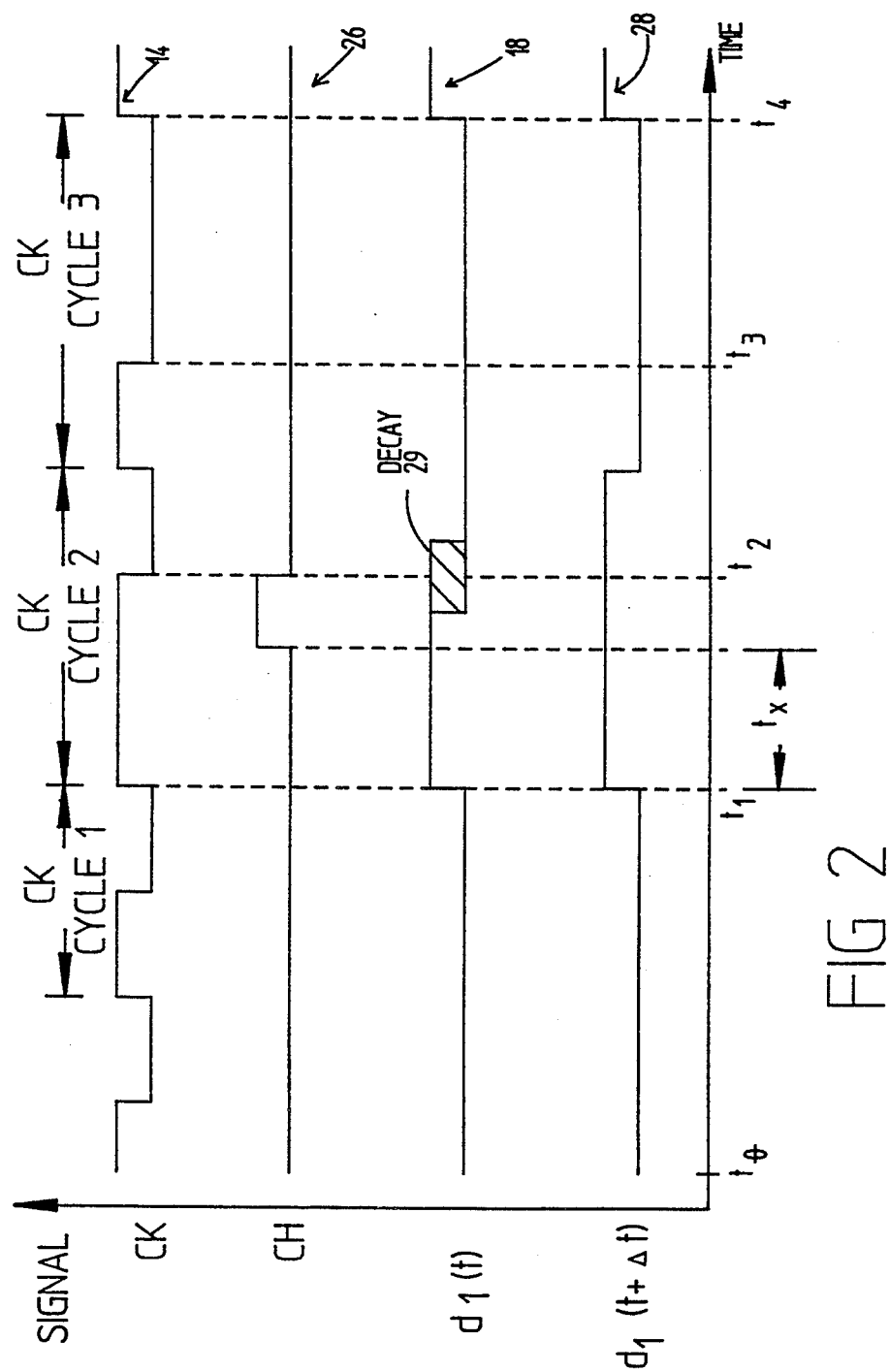
FIG. 2 shows a timing diagram corresponding to the slow clock detector and tolerant storage device of FIG. 1.

FIG. 2 shows an example of a timing diagram corresponding to the slow clock detector 22 of FIG. 1. For a clear understanding of the timing diagram in FIG. 2, a Table A is set forth below which parallels the operation of the timing diagram.

TABLE A

| Clock CK | CH Signal | $d_1(t)$ Stored? |
| --- | --- | --- |
| Normal frequency | 0 | No |
| Long high time | 0->1 (slowly) | Yes |
| Long low time | 0 | Yes |
| CK falling from long high | 1->0 (fast) | No |
| CK rising from long low | 0 | No |

During operation, the tolerant storage device 24 is transparent when the CK clock signal 14 exhibits a normal frequency, as shown in FIG. 2 during the time intervals $t_0 < t < t_1$, $t_2 < t < t_3$, and $t > t_4$. However, when the CK clock signal 14 exhibits a slow rate, or frequency, then the tolerant storage device 24 will latch the data $d_1$ until the frequency increases.

More specifically, with reference to FIG. 2, when the CK clock signal 14 exhibits a logic low ("0") at normal frequency, the tolerant storage device 24 latches the data $d_1$. In the example of FIG. 2, the $d_1(t)$ signal 18 is at a logic low in the normal frequency cycle 1 of the CK clock signal 14 and, therefore, a logic low is latched in the tolerant storage device 24, as indicated by the $d_1(t+$delta $t)$ output 28.

However, when the CK clock signal 14 remains, or is "halted", at a logic high ("1") for a relatively long time $t_x$ as shown in CK cycle 2, the CH signal 26 transitions to a logic high, thereby causing the tolerant storage device 24 to preserve the logic value of the data $d_1$ irrespective of any decay in $d_1$ which might occur, as denoted by reference numeral 29. The CH signal 26 remains at a logic high until the CK clock signal 14 transitions back to a logic low at a time $t_2$. The CH signal 26 then transitions back to a logic low very quickly so that subsequent clock edges and states are not missed.

When the CK clock signal 14 is halted for a relatively long period at a logic low, as indicated in CK cycle 3 in the time interval $t_3 < t < t_4$, the CH signal 26 remains at a logic low because the data $d_1$ is latched by the CK clock signal 14 in the tolerant storage device 24. In CK cycle 3, $d_1$ is shown, as an example, to be at a logic low.

It should be noted that the slow clock detector 22 could have been designed so that the CH signal 26 also transcended to a logic high upon the CK clock signal 14 being halted at a logic low, such as during the time interval $t_3 < t < t_4$. In this case, the tolerant storage device 24 would latch the data $d_1$ during the period when the CK clock signal 14 is halted at a logic low by redundant command of the CH signal 26 and the CK clock signal 14.

Furthermore, in a substantially symmetric manner, the foregoing discussion applies to systems where the dynamic logic circuit 12 evaluates when the clock CK exhibits a logic low. In such case, the tolerant storage device 24 stores data when either the clock CK is at a logic high by command of the clock CK, or when the clock CK is halted at a logic low by command of the tolerant storage device 24.

The architecture of the slow clock detector 22 for generating the CH signal 26 as shown in FIG. 2 can take various configurations, as is well known in the art. The slow clock detector 22 may be implemented with a retriggerable one-shot latching device, which is well known in the art. In the preferred embodiment, a retriggerable one-shot latching device is constructed from combinational logic and capacitors as shown in FIG. 3.

Figure 3:
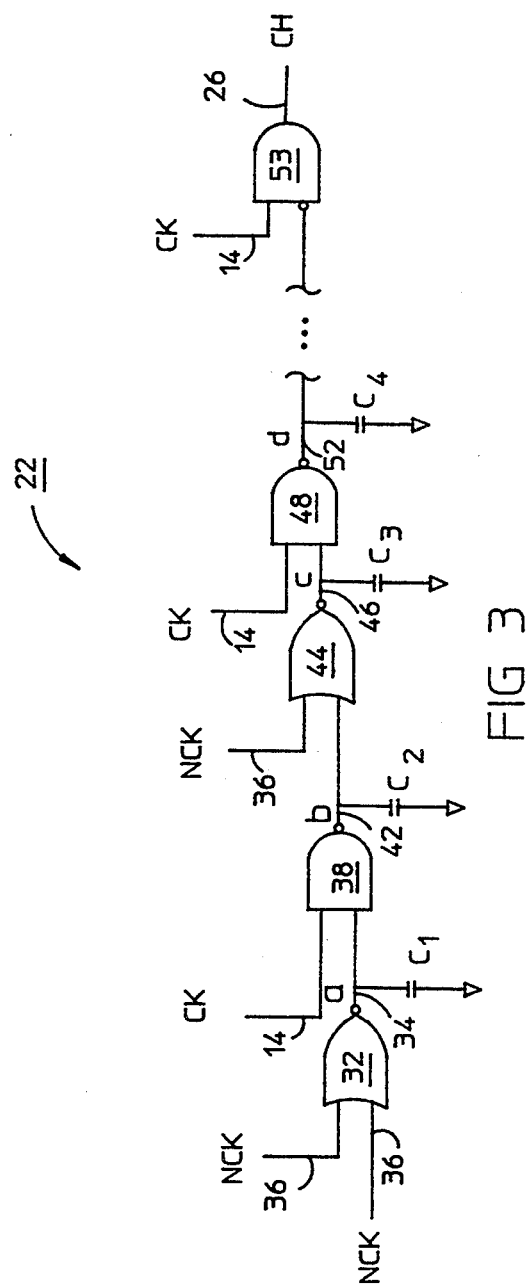
FIG. 3 shows a low level block diagram of the slow clock detector of FIG. 1.

Referring to FIG. 3, the slow clock detector 22 is derived by cascading four stages of the circuit shown. The inverse of the CK clock signal 14, called the NCK clock signal 36, is fed into both inputs of a two-input NOR logic gate 32, which has a capacitor $C_1$ disposed between its output 34 (node a) and ground. The output 34 is then inputted along with the CK clock signal 14 to a two-input NAND logic gate 38. The NAND logic gate 38 generates an output 42 (node b) having a capacitor $C_2$ disposed between the output 42 and ground.

Further, the output 42 and the NCK clock signal 36 are inputted to a two-input NOR logic gate 44 so as to generate an output 46 (node c). A capacitor $C_3$ is disposed between the output 46 and ground. Finally, the output 46 and the CK clock signal 14 are inputted to a two-input NAND logic gate 48 in order to produce an output 52 (node d). A capacitor $C_4$ is disposed between the output 52 and ground.

In essence, the circuit of FIG. 3 provides a time-delayed output which will arise during a slow clock condition when the clock CK is halted at a logic high. The time delay $t_x$ is implemented and defined by the capacitance values of the capacitors $C_1$, $C_2$, $C_3$, and $C_4$. Moreover, when the CK clock signal 14 transitions from a logic high to a logic low, the slow clock detector 22 of FIG. 3 is reset so that a logic low CH signal 26 is outputted to the tolerant storage device 24.

Figure 4:
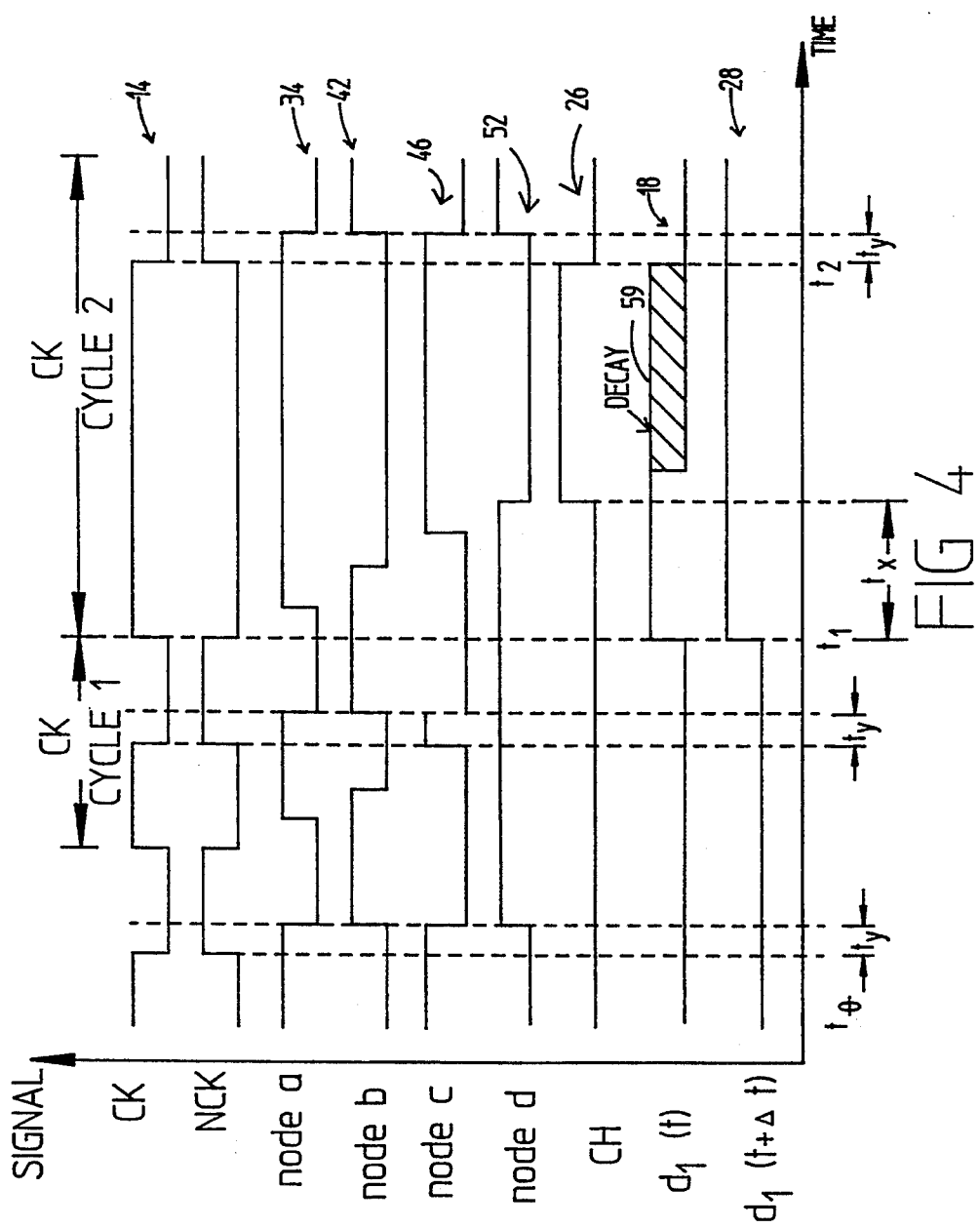
FIG. 4 shows a timing diagram corresponding with the slow clock detector of FIG. 3.

For a better understanding of the operation of the slow clock detector 22 of FIG. 3, an example of a timing diagram for the same is shown in FIG. 4. FIG. 4 clearly indicates the signal response of the slow clock detector 22 at successive electrical nodes a–d, denoted by respective reference numerals 34, 42, 46, 52 in FIG. 3. As shown in FIG. 4, each of the capacitors $C_1$, $C_2$, $C_3$, and $C_4$ introduces a time delay $t_y$. Essentially, the time delay $t_y$ is the amount of time necessary for each capacitor to charge. Moreover, the sum of all time delays $t_y$ equals the total time delay $t_x$, which denotes the time after which the CH signal 26 will go to a logic high. The more logic gates added to the circuit of FIG. 3, the more time delays $t_y$ introduced.

As shown in FIG. 4, when the CK clock signal 14 remains, or is "halted", at a logic high for a relatively long time $t_x$ as shown in CK cycle 2, the CH signal 26 transitions to a logic high, thereby causing the tolerant storage device 24 to preserve the logic value of the data $d_1$ irrespective of any decay in $d_1$ which might occur, as denoted by reference numeral 59.

It should be emphasized that the circuit of FIG. 3 is a specific embodiment and that a multiplicity of circuit options are available for constructing a retriggerable one-shot latching mechanism, as is well known in the art. Furthermore, in the preferred embodiment, the circuit of FIG. 3 is constructed from field effect transistors (FET).

Figure 5:
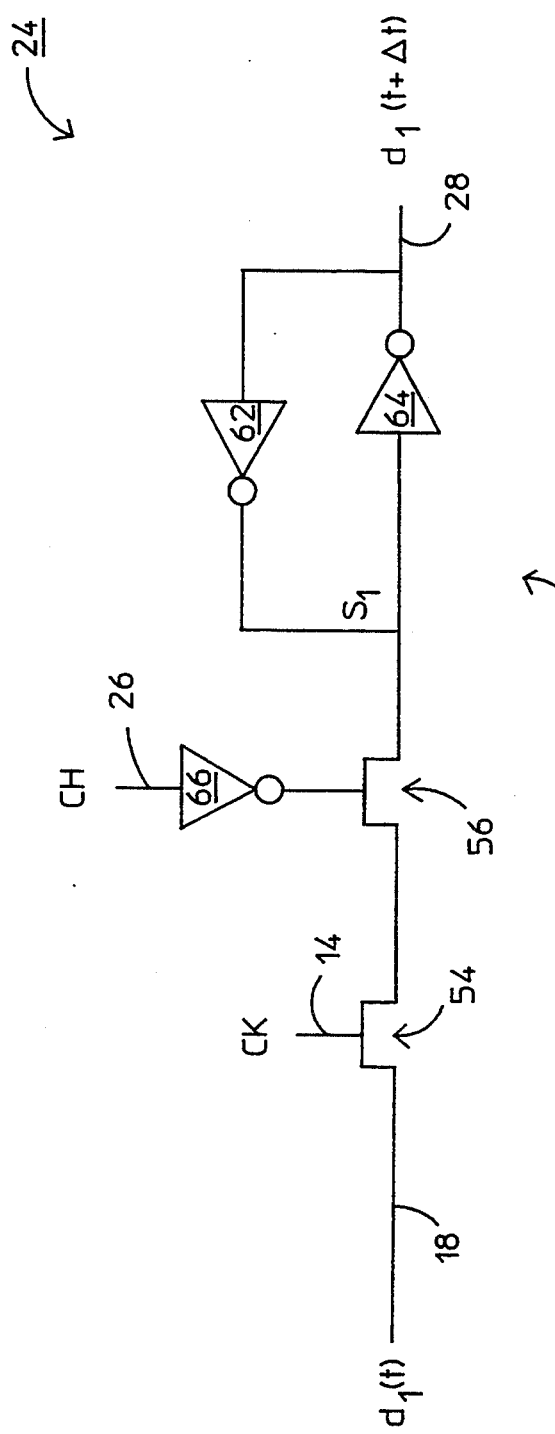
FIG. 5 shows a low level block diagram of the tolerant storage device of FIG. 1.

The tolerant storage device 24 is preferably configured as shown in FIG. 5. Transistors 54, 56 are disposed in series with the data $d_1(t)$ 18 along with a transparent D-latch 58. The transparent D-latch 58 comprises inverters 62, 64 so as to store, or latch, a logic value $s_1 = d_1(t)$ at every clock edge of CK clock signal 14. Further, an inverter 66 is disposed so as to derive the proper logic state of the CH signal 26. The inverters 62, 64, 66 are preferably implemented with CMOSFET technology.

In operation, when the CK clock signal 14 is halted at a logic high, the CH signal 26 will transition to a logic high, thereby turning off transistor 56, and consequently, the stored value $s_1$ in the transparent D-latch 58 is isolated from the dynamic logic circuit 12 to prevent tainting of the logic value which may result from precharge decay. After a time delta $t$, the proper logic value of data $d_1$ is presented at the output 28.

When the CK clock signal 14 is halted at a logic low or when the CK clock signal 14 exhibits a logic low during normal frequency, the CH signal 26 will remains at a logic low, but the transistor 54 is turned off as a result of the CK clock signal 14. Accordingly, the stored value $s_1$ in the transparent D-latch 58 is stored and isolated from the dynamic logic circuit 12.

The foregoing description of the preferred embodiment has been presented for purposes of illustration and description. It is not intended to be exhaustive or to limit the present invention to the precise form disclosed, and obviously many modifications are possible in light of the above teachings. Any such modifications are intended to be included within the scope of the present invention.

Wherefore, we claim the following:

1. A system for preserving data outputs from dynamic logic circuits which are precharged and which are subject to decay, the system comprising:

a dynamic logic circuit having a data output, said dynamic logic circuit for receiving a clock signal having first and second clock states, said dynamic logic circuit being periodically precharged by said clock signal;

a slow clock detector means for receiving said clock signal and for generating a clock halt output, said slow clock detector means for generating first and second logic states on said clock halt output, said second logic state being generated during a halt condition, said halt condition beginning after said clock signal has remained at said second clock state for a predetermined time period until said clock signal exhibits said first clock state, said first logic state being generated in the absence of said halt condition; and a tolerant storage means for receiving said data output, said clock signal, and said clock halt output, said tolerant storage means for storing said data output when said second logic state is received on said clock halt output and for storing said data output when said first clock state is received from said clock signal.

2. The system of claim 1, wherein said slow clock detector means comprises a retriggerable one-shot latching device having a time-delayed output.

3. The system of claim 1, wherein said slow clock detector means comprises a combinational logic network having a network input and a network output, said combinational logic network being clocked by said clock signals said combinational logic network for providing a time delay for propagation of a signal from said network input to said network output, said time delay for defining said predetermined time period, said network input for receiving said clock signal.

4. The system of claim 1, wherein said tolerant storage means comprises a transparent D-latch which latches data when said second logic state is received by said D-latch on said clock halt output and latches data when said first clock state is received from said clock signal.

5. The system of claim 1, wherein said dynamic logic circuit comprises a mousetrap logic gate.

6. The system of claim 1, wherein said dynamic logic circuit comprises a domino logic gate.

7. The system of claim 3, wherein said combinational logic network comprises a cascaded series of alternating NOR and NAND logic gates having capacitors connected between inputs of said logic gates and ground, said capacitors for defining said time delay.

8. A system for preserving data outputs from dynamic logic circuits which are precharged and which are subject to decay, the system comprising:

a dynamic logic circuit having a data output, said dynamic logic circuit for receiving a clock signal, said dynamic logic circuit being periodically precharged by said clock signal;

a slow clock detector means for receiving said clock signal and for generating a clock halt output, said slow clock detector means for generating first and second logic states on said clock halt output, said second logic state being generated during a halt condition, said halt condition beginning after said clock signal has remained at a clock state for a predetermined time period until said clock signal exhibits another clock state, said first logic state being generated in the absence of said halt condition; and a tolerant storage means for receiving said data output and said clock halt output, said tolerant storage means for storing said data output when said second logic state is received on said clock halt output.

9. The system of claim 8, wherein said slow clock detector means comprises a retriggerable one-shot latching device having a time-delayed output.

10. The system of claim 8, wherein said slow clock detector means comprises a combinational logic network having a network input and a network output, said combinational logic network being clocked by said clock signal, said combinational logic network for providing a time delay for propagation of a signal from said network input to said network output, said time delay for defining said predetermined time period, said network input for receiving said clock signal.

11. The system of claim 8, wherein said tolerant storage means comprises a transparent D-latch which latches data when said second logic state is received by said D-latch on said clock halt output.

12. The system of claim 8, wherein said dynamic logic circuit comprises a mousetrap logic gate.

13. The system of claim 8, wherein said dynamic logic circuit comprises a domino logic gate.

14. The system of claim 10, wherein said combinational logic network comprises a cascaded series of alternating NOR and NAND logic gates having capacitors connected between inputs of said logic gates and ground, said capacitors for defining said time delay.

15. A method for tolerating the decay of a data output from a dynamic logic circuit precharged by a clock signal having first and second clock states, the method comprising the steps of:

detecting a halt condition when said clock signal has remained at the first clock state for a predetermined time period;

latching the data output when said clock signal exhibits said first clock state; and latching the data output during a period beginning when said halt condition occurs until said first clock state changes to said second clock state.

16. The method of claim 15, further comprising the steps of:

defining said predetermined time period by implementing a circuit with a propagation delay; and passing said clock signal through said circuit.

17. The method of claim 15, further comprising the step of employing a mousetrap logic gate in said dynamic logic circuit.

18. The method of claim 15, further comprising the step of employing a domino logic gate in said dynamic logic circuit.

* * * * *